United States Patent
Bezama et al.

(10) Patent No.: US 7,107,901 B2
(45) Date of Patent: Sep. 19, 2006

(54) METHOD AND APPARATUS FOR RAPID COOLING OF METAL SCREENING MASKS

(75) Inventors: Raschid J Bezama, Mahopac, NY (US); William W Harkins, Montgomery, NY (US); David C Long, Wappingers Falls, NY (US); Jason S Miller, Poughkeepsie, NY (US); Christopher E Pepe, Middletown, NY (US); Ronald M Rothkranz, Staatsburg, NY (US); John A Rudy, Wappingers Falls, NY (US); Benjamin P Tongue, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 10/685,202

(22) Filed: Oct. 14, 2003

(65) Prior Publication Data

US 2005/0077025 A1 Apr. 14, 2005

(51) Int. Cl.
*B41L 13/00* (2006.01)

(52) U.S. Cl. .................. 101/126; 101/127.1; 101/129; 101/423; 34/19; 34/105

(58) Field of Classification Search .................... None
See application file for complete search history.

(56) References Cited

U.S. PATENT DOCUMENTS 2,004,796 A * 6/1935 Payne .......................... 134/20

| | | | |
|---|---|---|---|
| 4,483,040 A | 11/1984 | Magee et al. | |
| 4,717,645 A * | 1/1988 | Kato et al. ................... | 430/296 |
| 4,776,271 A | 10/1988 | Schlipf et al. | |
| 5,578,151 A | 11/1996 | Andris et al. | |
| 5,916,374 A * | 6/1999 | Casey et al. ................... | 134/37 |
| 6,012,388 A | 1/2000 | Shirakawa et al. | |
| 6,202,551 B1 | 3/2001 | Murakami | |
| 6,280,527 B1 | 8/2001 | Sachdev et al. | |

FOREIGN PATENT DOCUMENTS

| JP | 58102768 | 6/1983 |
|---|---|---|
| JP | 05154986 | 6/1993 |

* cited by examiner

*Primary Examiner*—Andrew H. Hirshfeld
*Assistant Examiner*—Jill E. Culler
(74) *Attorney, Agent, or Firm*—DeLio & Peterson, LLC; John J. Tomaszewski; James J. Cioffi

(57) ABSTRACT

A method and apparatus for the rapid cooling of screen masks used in the fabrication of semiconductor components is provided. The method and apparatus use a specially designed cooling plate which is contacted with a mask frame holding the screening mask. After a heated cleaning step which cleans the mask frame and screening mask of metal paste used in the screening operation, the cooling plate having one or more concave lower surfaces contacts the upper surfaces of the mask frame and bends the mask frame in the shape of the concave surfaces. This ensures intimate contact between the cooling plate and mask frame and enhances the thermal efficiency of the cooling step.

14 Claims, 10 Drawing Sheets

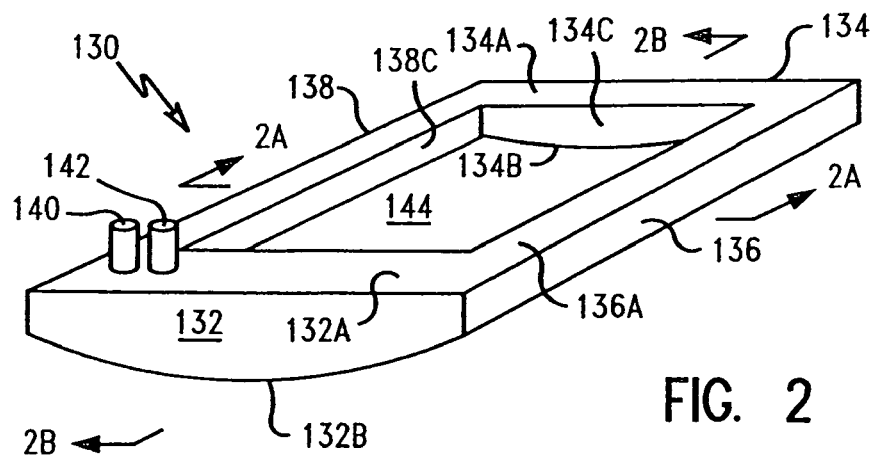
FIG. 2
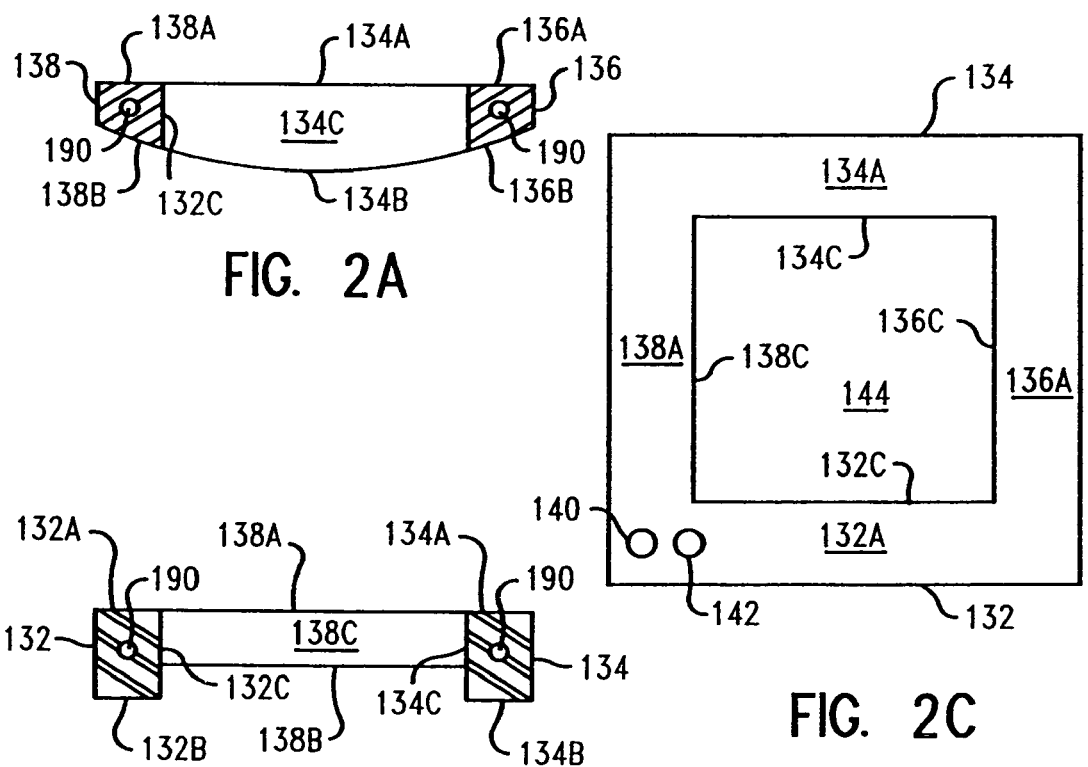
FIG. 2A
FIG. 2B
FIG. 2C

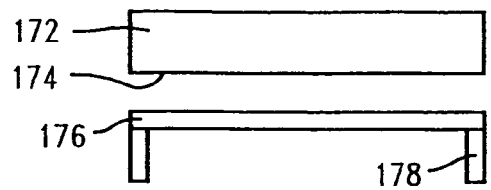
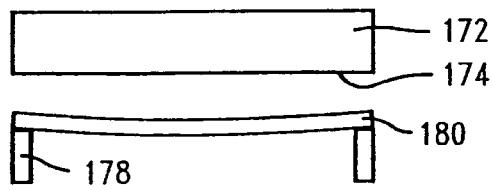
FIG. 5A　　　　FIG. 6A
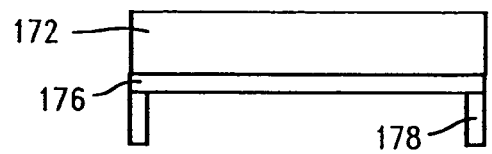
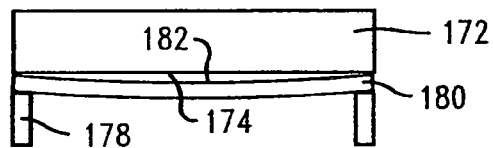
FIG. 5B　　　　FIG. 6B
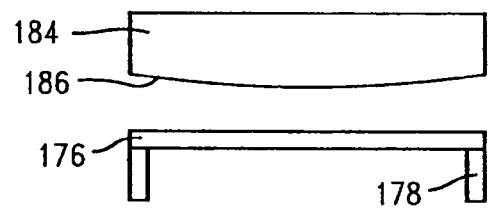
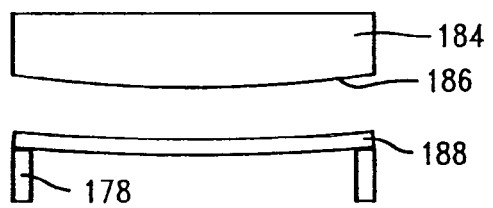
FIG. 7A　　　　FIG. 8A
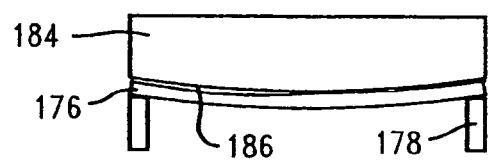
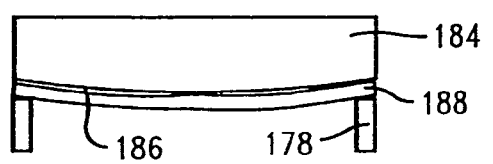
FIG. 7B　　　　FIG. 8B

METHOD AND APPARATUS FOR RAPID COOLING OF METAL SCREENING MASKS

BACKGROUND OF THE INVENTION

1. Field of the Invention

The present invention generally relates to screen printing and more particularly to a method for minimizing the distortion of a screening mask used in the screen printing process by controlling the cooling of a screening mask frame holding the screening mask after the screening mask has been cleaned at an elevated temperature and which frame and screen is then to be returned to the screen printing step of the process.

2. Description of Related Art

Screen printing to form a desired pattern on a substrate is very well known in the art. In general, the lower surface of a mask having a desired pattern is placed in contact with a substrate and a fluid material applied to the upper surface of the mask. The fluid material is then forced through the mask pattern (openings) onto the substrate forming the desired pattern. For convenience, the following description will be directed to the manufacture of semiconductor electronic components although it will be appreciated by those skilled in the art that the invention may be used for other screen printing processes.

In the fabrication of multi-layer ceramic substrates (MLC) for making semiconductor devices, conductive metal patterns are screened on individual ceramic greensheets by screen printing. In this process a screening mask, such as a metal mask, is placed in contact with the greensheet and a metallic paste is squeegeed on the greensheet surface through the mask pattern openings. After screening, the greensheets are assembled, aligned and laminated followed by a sintering operation to form a MLC. Fabrication techniques for making semiconductor devices including design, screening equipment and post screening processes are well known in the art.

The ground rules for making semiconductor devices continues to shrink, however, and maintaining tight control of pattern feature size and locations and mask tension of the mask screen becomes increasingly important. One problem in the screening process is that after the screening operation, paste residue is entrapped in the mask features in addition to a surface residue which is left on the screen surface. This requires that the mask be cleaned after one or more screening passes to eliminate/minimize the possibility of defects in subsequently screened patterns. Any defects in the screened paste pattern replicates into the final product causing a defective pattern and rejection of the product.

Using automated screening and mask cleaning processes, mask cleaning is typically preferred after one or more screening passes depending on whether the paste is fast drying or slow drying, otherwise the paste residue on the mask can cause defects in subsequently screened conductive patterns. Screening masks are typically made of metal, such as etched Ni or Mo masks. The screening paste used for defining via and wiring metallurgy patterns on the ceramic greensheets are typically comprised of a metal such as molybdenum, copper, tungsten, nickel, gold, platinum and silver. Some pastes may also contain inorganic fillers such as glass or ceramic powder, dispersed in an organic polymer binder in a high boiling organic solvent vehicle. Other additives include surfactants/dispersants, coloring agents, thickening agents or viscosity modifiers and antioxidants, etc.

In one in-line screening process, the screening mask secured in a frame, usually square, is supported on spaced apart rails whereby the front side and rear side of the frame traverse the space between the rails and the opposed sides of the frame rest on the opposed rails. In this system, the screening mask is secured to the lower side of the frame and the mask is suspended between the spaces of the rails. A greensheet is then positioned adjacent the screening mask and a conductive paste is applied to the upper surface of the screen and squeegeed onto the greensheet surface. After the screening operation the greensheet is removed and the frame and screening mask, which is now coated with excess paste, must be cleaned and the frame and screening mask assembly is moved to the cleaning section.

One technique for cleaning screen masks is by pressure spray cleaning with chemical solutions such as a dilute solution of tetramethyl ammonium hydroxide (TMAH) and/or related quaternary ammonium hydroxides. It is preferred that the mask cleaning be performed using a high pressure spray with a heated TMAH solution since this provides a reduction in cleaning cycle time. In general, and as described in U.S. Pat. No. 6,280,527 to Sachdev et al., which patent is incorporated herein by reference, Mo metal masks carrying conductive paste residue from the screening step are spray cleaned with an aqueous TMAH solution comprising less than 1 weight % TMAH in water. In one process the screening mask is sprayed for about 30 to 45 seconds using a hand-held spray nozzle or with a multi-nozzle spray at between about 50 and 70 psi and between about 130° F. to about 150° F. solution temperature. The mask can also be cleaned in less than about 15 seconds to about 20 seconds using a high pressure spray wash employing a specially designed multi-nozzle system at between about 150 and 200 psi and 130° F. and 180° F. in an automated in-line screening and mask cleaning machine such as described in U.S. Pat. No. 4,483,040, the disclosure of which is incorporated herein by reference. Subsequent to cleaning with TMAH, the screen masks are typically immediately rinsed with water and dried, preferably with forced hot air or nitrogen.

It is at this point in the screen printing process that distortion of the screening mask can occur because of the difference in cooling between the screening mask, which is relatively thin, and the mask frame which holds the screening mask, and which is relatively thick. In general, a screening mask is about 3 to 4 mils and a mask frame is about ⅛ inch thick. During the cooling the screening mask cools faster than the mask frame and the difference in cooling may cause a distortion of the screening mask and screening mask pattern.

Thick-film silk-screen and metal mask printing is used in the microelectronics industry to produce personalized conductive features for microchip packaging and solder paste applications. As ground rules continue to shrink, maintaining tight control of feature location and mask tension becomes increasingly important. Several patents disclose methods for maintaining such control. Japanese Patent No. JP58102768 discloses a method for heating mask frames using resistive heating elements. Japanese Patent No. JP5154986 improves on this patent by enabling both heating and cooling of the frame using fluid heat exchangers embedded within the mask frame. The addition of cooling capability is especially useful because it enables the compensation for rise in ambient temperature or for process-related temperature increases such as mask cleaning operations. Inherent in both of these methods is the requirement for modification of existing mask frames to accommodate the corresponding methods. For the former disclosure, heating elements would need to be affixed to the outside of the mask frame. For the latter, internal coolant passages would need to be formed inside the frame. The latter method would require a frame of sufficient thickness to accommodate said passages. Neither of these methods lends itself to easy implementation on a large inventory of existing mask frames, especially if existing mask frames are relatively thin (less than 0.25 in. thick) mask resulting in oblong vias and other such distortions of the pattern.

Bearing in mind the problems and deficiencies of the prior art, it is therefore an object of the present invention to provide a method of screen printing which minimizes distortion of the screening mask caused by cooling of the screening mask after an elevated temperature cleaning step.

It is another object of the present invention to provide an apparatus for screen printing which minimizes distortion of the screening mask caused by cooling of the screening mask after an elevated temperature cleaning step.

A further object of the present invention is to provide a cooling plate for cooling a mask frame which holds a screening mask.

Still other objects and advantages of the present invention will in part be obvious and will in part be apparent from the specification.

SUMMARY OF THE INVENTION

The above and other objects and advantages, which will be apparent to one of skill in the art, are achieved in the present invention which is directed to a method utilizing a specially configured external thermal conduction cooling source which is brought into contact with a planar mask frame holding a screen printing mask to cool the mask frame and screening mask and thereby minimize printed feature distortion of the screening mask. The external thermal conduction element (cooling plate) is preferentially made of copper and is preferably temperature controlled by internal heat exchanger passages connected to an external temperature-controlled fluid heat exchange source. Effective heat transfer between the cooling plate and mask frame is accomplished through intimate contact of the surface or surfaces of the cooling plate and the corresponding surface or surfaces of the mask frame wherein one or more lower surfaces of the cooling plate is concave downward and the mask frame is supported so that when the cooling plate contacts the upper surface of the mask frame the mask frame is bent downward to substantially conform to the shape of the cooling plate. This increases the contact surface area between the cooling plate and the mask frame and increases the heat transfer efficiency. The cooling plate is primarily used to return the mask frame to room temperature after an elevated temperature mask cleaning cycle. The cooling plate can also be used to bring the mask frame to any desired temperature above or below ambient.

In a first aspect, a method of screen printing comprises the steps of:

providing a screen printing apparatus including a screening section having means to apply a screening paste onto a surface of a screening mask secured to a mask frame and which paste is forced through openings in the screening mask to form a pattern on a substrate surface, a cleaning section having means to clean the screening mask of screening paste residue and a cooling section for cooling the cleaned screening mask, the cooling section having spaced apart rails or supports on which the mask frame rests wherein one or more of the sides of the mask frame is cantilevered and can be bent in the space between the rails or supports;

providing a planar mask frame having a front side, a rear side, and opposed sides and corresponding upper surfaces and lower surfaces and a central through opening therein;

securing the screening mask to the lower surfaces of the mask frame, the screening mask having mask openings therein in the central opening of the mask frame forming a pattern to be screened onto the substrate surface;

providing a cooling plate in the cooling section having a front side, rear side and opposed sides and corresponding lower surfaces and upper surfaces which lower surfaces contact the corresponding upper surfaces of the mask frame, with at least one of the lower surfaces of the cooling plate being concave downward;

providing means to vertically raise and lower the cooling plate;

positioning the mask frame and a screening mask in the screening section;

positioning a substrate under the screening mask;

applying a screening paste to the screening mask and forming a pattern of screening paste on the substrate surface;

removing the screened substrate and moving the mask frame and mask screen to the cleaning section;

cleaning the mask screen at an elevated temperature;

moving the heated cleaned screening mask and mask frame to the cooling section;

lowering the cooling plate and contacting the corresponding lower surfaces of the cooling plate with the upper surfaces of the mask frame whereby the corresponding sides of the mask frame and cooling plate mate and one or more sides of the mask frame is bent downward because of the concave curvature of the lower surface of the cooling plate;

cooling the mask frame and screening mask with the cooling plate; and removing the cooled mask frame and screening mask from the cooling section and moving the frame and mask to the screening section for screening another substrate.

In another aspect, a method of cooling a mask frame and screening mask used in a screen printing process comprises the steps of:

providing a cooling section having spaced apart rails or supports on which a mask frame holding a screening mask rests wherein one or more of the sides of the mask frame is cantilevered and can be bent in the space between the rails or supports;

providing a cooling plate in the cooling section having a front side, rear side and opposed sides and corresponding lower surfaces and upper surfaces which lower surfaces contact the corresponding upper surfaces of the mask frame, with at least one of the lower surfaces of the cooling plate being concave downward;

providing means to vertically raise and lower the cooling plate;

moving a heated cleaned screening mask and mask frame to the cooling section;

lowering the cooling plate and contacting the lower surfaces of the cooling plate with the upper surfaces of the mask frame whereby the corresponding sides of the mask frame and cooling plate mate and one or more sides of the mask frame is bent downward because of the concave curvature of the lower surface of the cooling plate;

cooling the mask frame and screening mask with the cooling plate; and removing the cooled mask frame and screening mask from the cooling section.

In another aspect of the invention an apparatus is provided for screen printing a substrate comprising:

a screening section having means to apply a screening paste onto a surface of a screening mask held on the lower surfaces of a mask frame, the frame having a front side, rear side, and opposed sides and corresponding upper surfaces and lower surfaces, and a central through opening therein;

a cleaning section having means to clean the screening mask of screen paste residue;

a cooling section for cooling the cleaned screening mask held in the mask frame, the cooling section having a pair of spaced apart rails or supports on which the lower surfaces of the mask frame rests wherein one or more sides of the frame is cantilevered with the screening mask secured to the lower side of the mask frame being between the rails or posts;

a cooling plate in the cooling section having a front side, rear side and opposed sides, and corresponding lower surfaces and upper surfaces which lower surfaces contact the upper surfaces of the mask frame, with at least one of the lower surfaces of the cooling plate being concave downward;

means to vertically raise and lower the cooling plate;

means for positioning the mask frame and the screening mask in the screening section;

means for positioning the substrate under the screening mask in the screening section;

means for applying a screening paste onto the surface of the screening mask and forming a pattern of screen paste on the substrate by forcing the screen paste through the openings in the screening mask;

means for removing the substrate from the screening mask and moving the mask frame and screening mask to the cleaning section;

wherein in the cleaning section, the mask frame and screening mask are cleaned at an elevated temperature and then moved to the cooling section where the cooling plate is lowered to contact the lower surfaces of the cooling plate with the upper surfaces of the mask frame whereby the front and rear sides of the mask frame and corresponding front and rear sides of the cooling plate are mated and one or more sides of the mask frame are bent downward because of the concave curvature of the lower surface of the cooling plate and the cantilevered mask frame, the mask frame and screening mask are cooled and the cooled mask frame and screening mask are moved to the screening section for screening another substrate.

In another aspect of the invention an apparatus is provided for cooling a mask frame and screening mask used in a screen printing process comprising:

a cooling section for cooling a cleaned screening mask held in a mask frame, the cooling section having a pair of spaced apart rails or supports on which the lower surfaces of the mask frame rests wherein one or more sides of the frame is cantilevered with the screening mask secured to the lower side of the mask frame being between the rails or posts;

a cooling plate in the cooling section having a front side, rear side and opposed sides, and corresponding lower surfaces and upper surfaces which lower surfaces contact the upper surfaces of the mask frame, with at least one of the lower surfaces of the cooling plate being concave downward;

means to vertically raise and lower the cooling plate;

means for positioning the cleaned mask frame and the screening mask in the screening section;

wherein in the cleaning section, the mask frame and screening mask are cleaned at an elevated temperature and then moved to the cooling section where the cooling plate is lowered to contact the lower surfaces of the cooling plate with the upper surfaces of the mask frame whereby the upper surfaces of the mask frame and corresponding lower surfaces of the cooling plate are mated and at least one of the sides of the mask frame are bent downward because of the concave curvature of the cooling plate and the cantilevered mask frame and the mask frame and screening mask are cooled.

In a further aspect of the invention a cooling plate is provided for cooling a mask frame holding a screening mask used in a screen printing process comprising:

a thermal conduction plate having a front side, rear side and opposed sides, corresponding upper surfaces and lower surfaces and the plate having one or more downward concave surface on the lower surface or surfaces.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 2 is a perspective view of a cooling plate of the invention.

FIG. 2A is a cross-sectional view of the cooling plate of FIG. 2 taken along lines 2A—2A.

FIG. 2B is a cross-sectional view of the cooling plate of FIG. 2 taken along lines 2B—2B.

FIG. 2C is a plan view of the cooling plate of FIG. 2.

FIGS. 5A and 5B show a conventional cooling plate used to cool a planar non-warped mask frame and the cooling plate in contact with the mask frame, respectively.

FIGS. 6A and 6B show a conventional cooling plate in position to cool a warped mask frame and the cooling plate in contact with the warped mask frame, respectively.

FIGS. 7A and 7B show a cooling plate of the invention in position to cool a non-warped mask frame and the cooling plate in contact with the mask frame, respectively.

FIGS. 8A and 8B show a cooling plate of the invention in position to cool a warped mask frame and the cooling plate in contact with the warped mask frame, respectively.

DESCRIPTION OF THE PREFERRED EMBODIMENT(S)

In describing the preferred embodiment of the present invention, reference will be made herein to FIGS. 1–10B of the drawings in which like numerals refer to like features of the invention.

Figure 1:
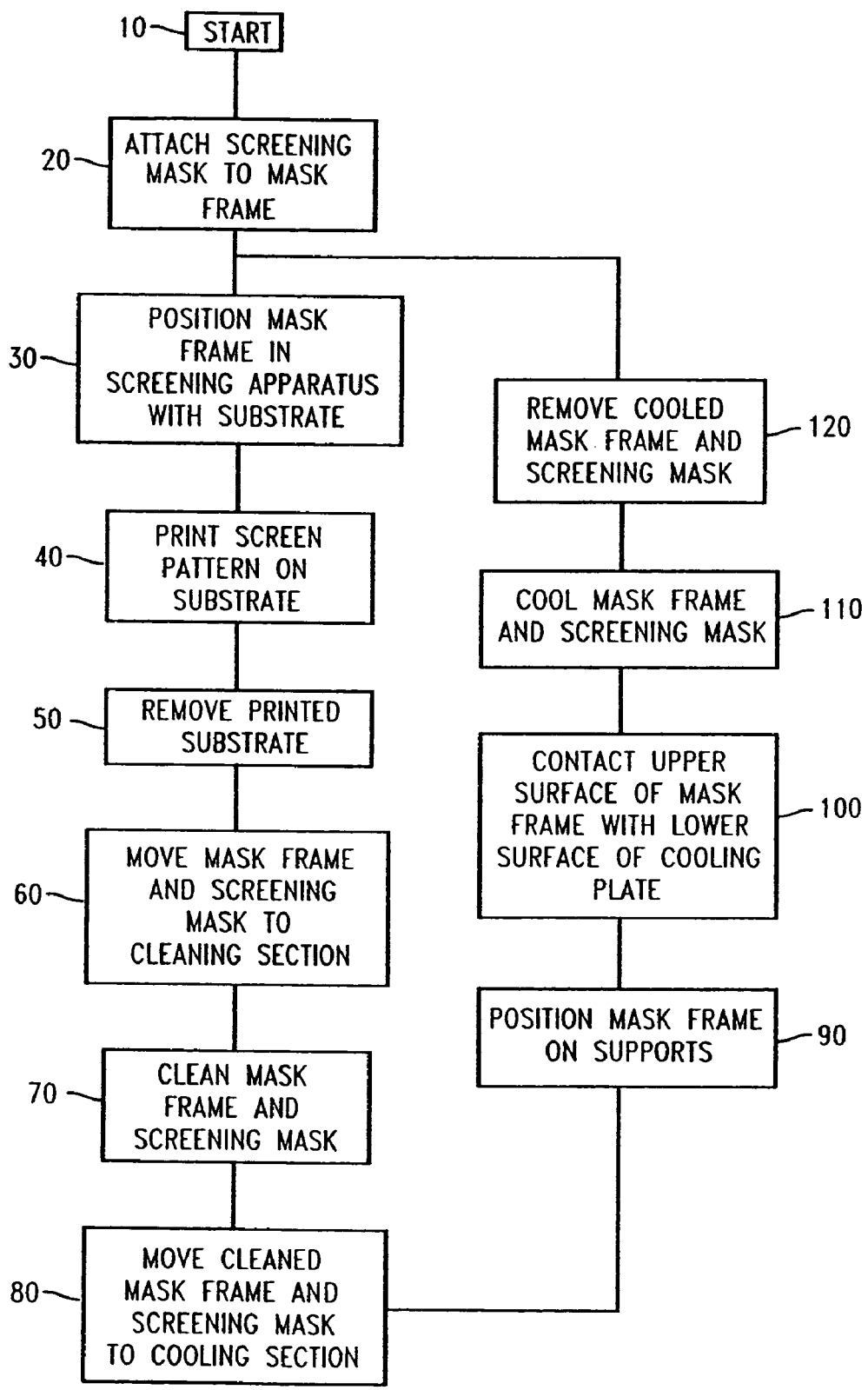
FIG. 1 is a flow sheet showing the method and apparatus of the invention.

Referring now to FIG. 1, the method and apparatus of the invention can be demonstrated. In step 10 the method is started and in step 20 a screening mask is attached to a mask frame. Securing the screening mask to the mask frame is conventional. In step 30 the mask frame is positioned in a screening apparatus and the substrate to be screen-printed is positioned adjacent the lower surface of the screening mask. In step 40 screening paste is applied to the upper surface of the screening mask and the paste forced through openings in the screening mask to print the screening mask pattern on a substrate. In step 50 the printed substrate is removed from the screening apparatus.

In step 60, the mask frame holding the screening mask is moved to a cleaning apparatus to remove residual paste from the screening process. In step 70 the screening mask and screening frame are cleaned using conventional techniques such as a hot pressure spray of a dilute TMAH solution as described above. The cleaning process heats the mask frame and the screening mask and it is the purpose of this invention to minimize distortion of the screening mask by controlled cooling of the screening mask and mask frame after the cleaning process.

Figure 3:
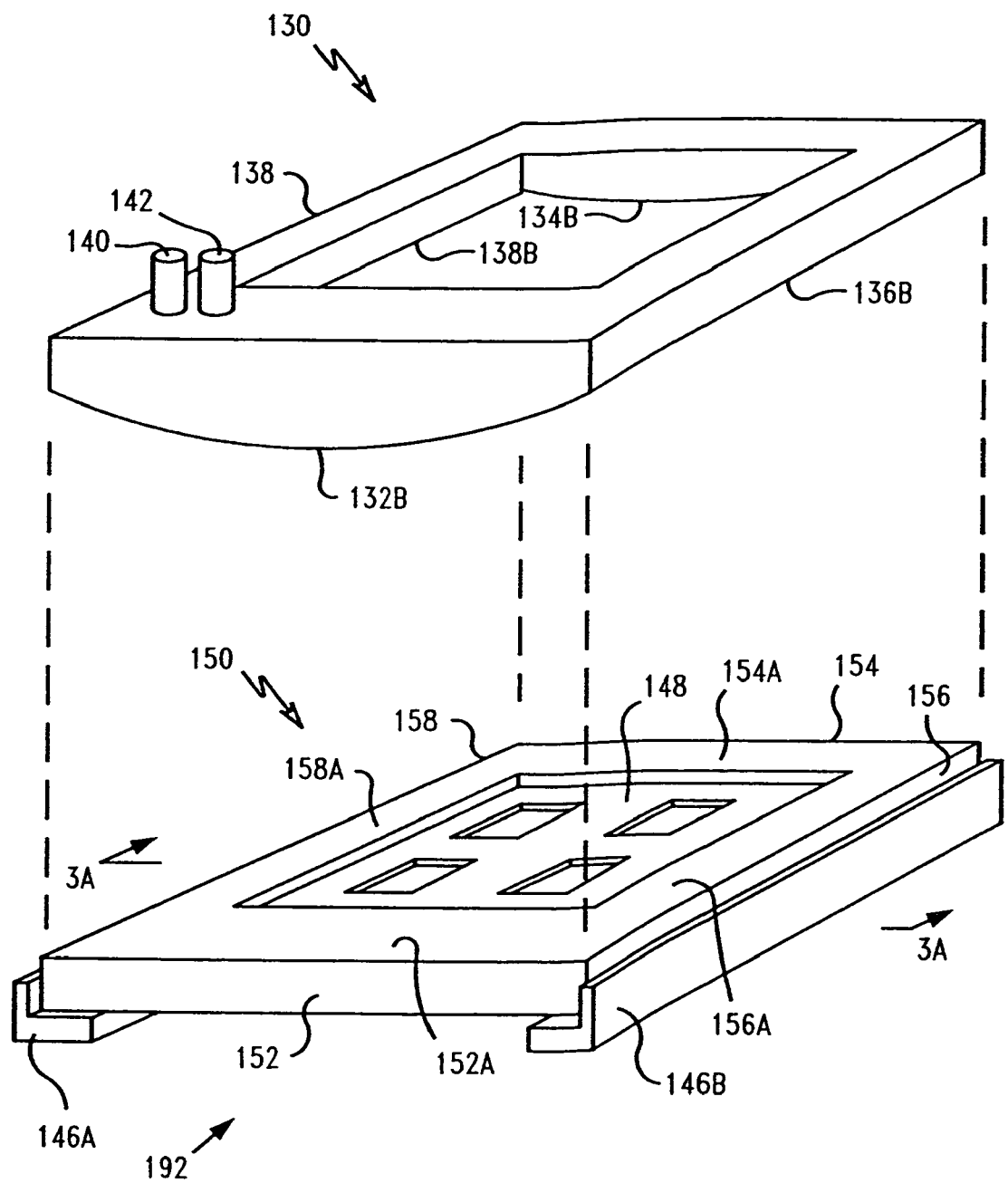
FIG. 3 is an exploded view of a mask frame holding a screening mask supported on spaced-apart rails and a cooling plate of the invention positioned above the mask frame and which will be lowered to contact the mask frame when cooling of the mask frame is desired.

The cleaned mask frame and screening mask are moved from the cleaning section to the cooling section in step 80. In step 90 the mask frame is positioned on supports so that the edges of the mask frame are supported but at least one middle portion of the mask frame is not supported. For example, only the opposed sides of the mask frame will be supported if continuous rails are used as shown in FIGS. 3–3B. If individual post supports are used at each corner of the mask frame then both the front and rear sides and opposed sides of the frame will be unsupported in the middle.

In step 100 the cooling plate of the invention is positioned above the mask frame and in contact with the mask frame. In this step the mask frame will bend because of the force and difference in thickness or flexibility between the cooling plate and mask frame and the curvature of the cooled plate and intimate contact will be achieved between the lower surface of the cooling plate and the upper surface of the mask frame. In step 110 the cooling plate is activated to cool the mask frame and screening mask. In step 120 the mask frame and screening mask have been cooled and the cooling plate is removed. The cooled mask frame and screening mask are then moved to step 30 to repeat the process.

Referring now to FIG. 2, a cooling plate of the invention is shown generally as 130. The cooling plate has a front side 132, a rear side 134, and opposed sides 136 and 138. There is a central through opening 144. The front side 132 has an upper surface 132A and a lower surface 132B. Likewise, the rear side 134 has an upper surface 134A and a lower surface 134B. The opposed sides 136 and 138 have upper surfaces 136A and 138A and lower surfaces 136B and 138B, respectively. The rear inside surface is shown as 134C and one of the opposed sides inside surface as 138C. The cooling plate has an inlet 140 for cooling water or other fluid cooling means and an outlet 142. In use, cooling water would be fed into inlet 140 and travels through openings in the cooling plate 130 and out cooling plate at outlet 142.

Figure 2D:
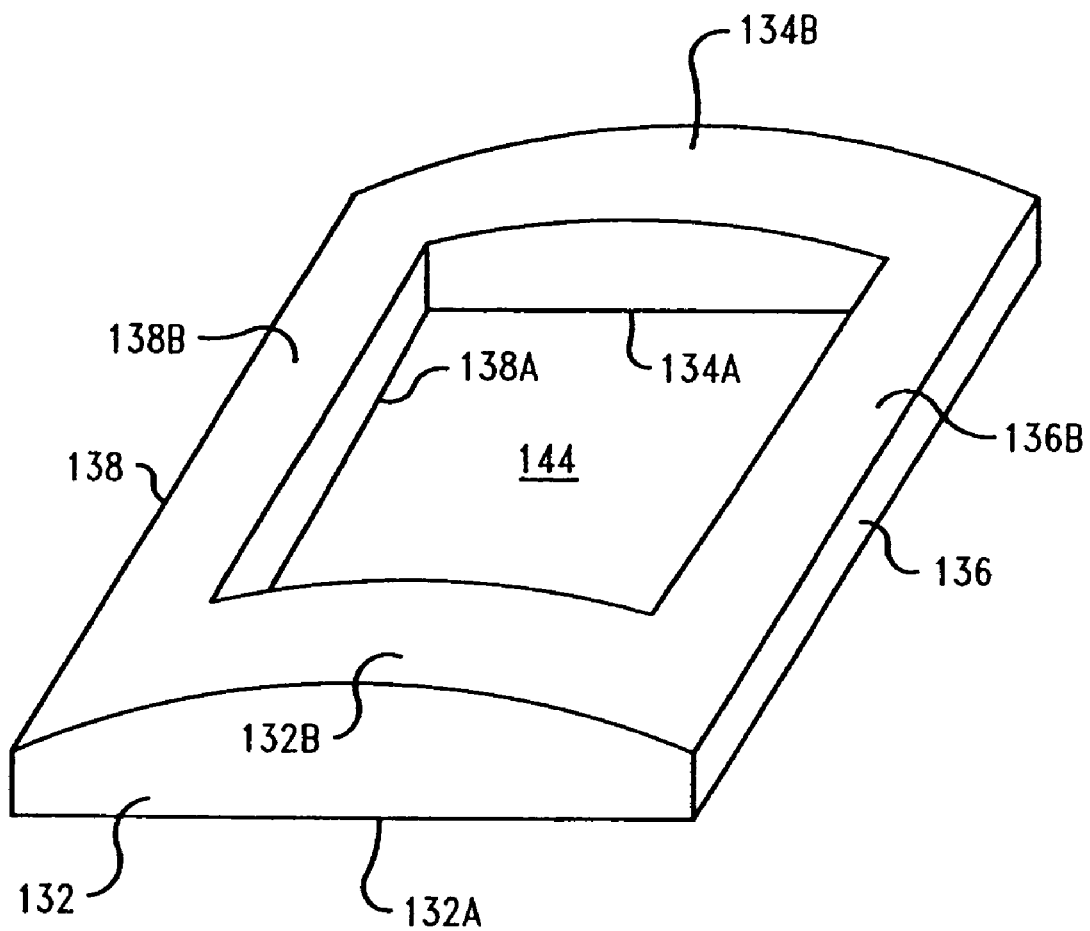
FIG. 2D is a perspective bottom view of the cooling plate of FIG. 2.

The cooling plate 130 has a downward concave front surface 132B and a downward concave rear surface 134B. As shown in FIG. 2D, opposed lower sides 136B and 138B are also concave downward in the same radius as the front and rear surfaces 132B and 134B. This is the preferred design since a block of metal can be used to make the cooling plate and be formed as a solid plate with the desired radius of curvature and the opening 144 then formed in the plate.

Referring now to FIG. 2A, a cross-sectional view of cooling plate of 130 is shown. The internal cooling passages which transport the water or other cooling fluid are shown as numeral 190. It should be noted again that the rear surface 134B is concave downward as are opposed sides of lower surfaces 138B and 136B.

FIG. 2B is another cross-sectional view of cooling plate 130 and shows the height of the curvature of front side 132B and rear side 134B as contrasted with the lower side 138B of opposed side 138.

FIG. 2C is a plan view of cooling plate 130 and shows upper surfaces 132A, 134A, 136A and 138A, the water cooling inlet port 140 and outlet port 142, and central opening 144.

FIG. 2D shows the lower curved surfaces of the cooling plate 130 of FIG. 2. Note that all surfaces 132B, 134B, 136B and 138B are all curved in the same arc.

FIG. 3 is an exploded view of a mask frame 150 holding a screening mask 148 which is ready to be cooled by cooling plate 130 which is positioned above the mask frame. Accordingly, a mask frame shown generally as 150 has a screening mask 148 secured to the lower surface thereof. The mask frame has a front side 152, a rear side 154 and opposed sides 156 and 158. Each side has an upper surface 152A, 154A, 156a and 158A, respectively. The mask frame is supported by opposed rails 146a and 146B. Numeral 192 shows where the mask frame is not supported in the space between the rails and sides 152 and 154 are cantilevered.

Figure 3A:
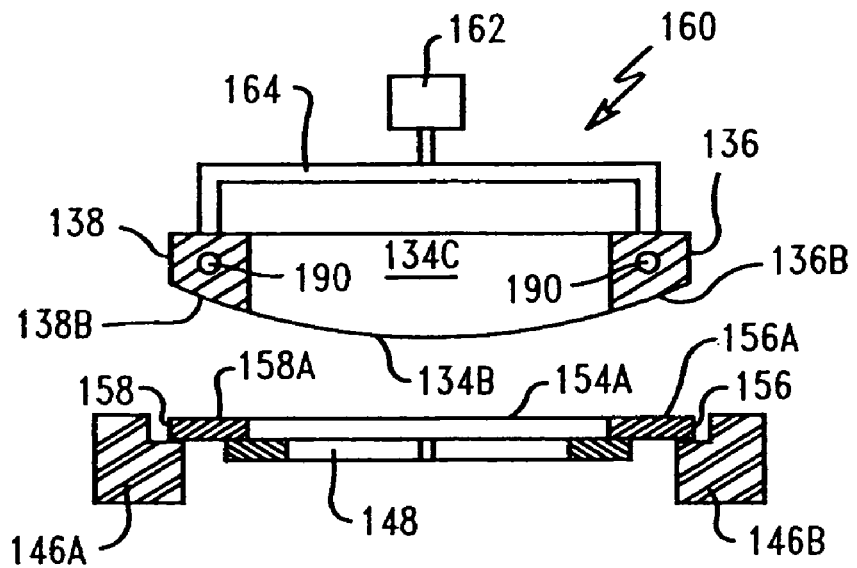
FIG. 3A is a cross-sectional view of the FIG. 3 taken along lines 3A—3A.
Figure 3B:
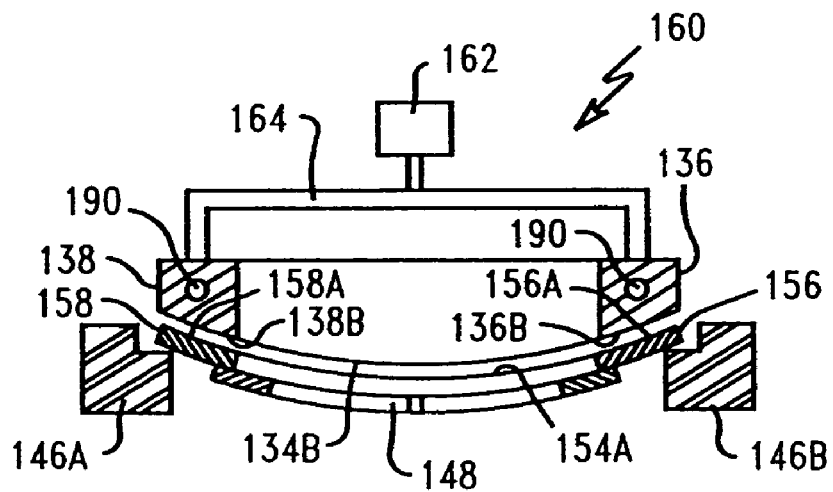
FIG. 3B shows the cooling plate and mask frame of FIG. 3A in the contacted cooling positioned.

FIG. 3A is a cross-sectional view of FIG. 3 taken along line 3A—3A. The opposed sides 156 and 158 of the mask frame are secured on rails 146A and 146B. The screening mask 148 is shown secured to the lower side of the mask frame and is between the spaces of the rails. The cooling plate is positioned above the mask frame and lower surfaces 138B and 136B and 134B of the cooling plate will contact upper surfaces 158A, 156A and 154A of the mask frame, respectively. A cooling plate press shown generally as numeral 160 is used to move the cooling plate up and down to make contact with the mask frame and to apply pressure to the mask frame. An air cylinder 162 is shown connected to support structure 164 which struts are secured to each upper surface of the cooling plate.

It is preferred to use a gimble mount so that he cooling plate is self-aligning when contacting the mask frame.

FIG. 3B shows the cooling plate moved downward to be in contact with the mask frame. As can be seen, the upper surface 154A of the mask frame is bent downward due to the curvature 134B of the cooling plate. Likewise, the opposed sides 156A and 158A are bent downward due to cooling plate surfaces 136B and 138B.

Figure 4A:
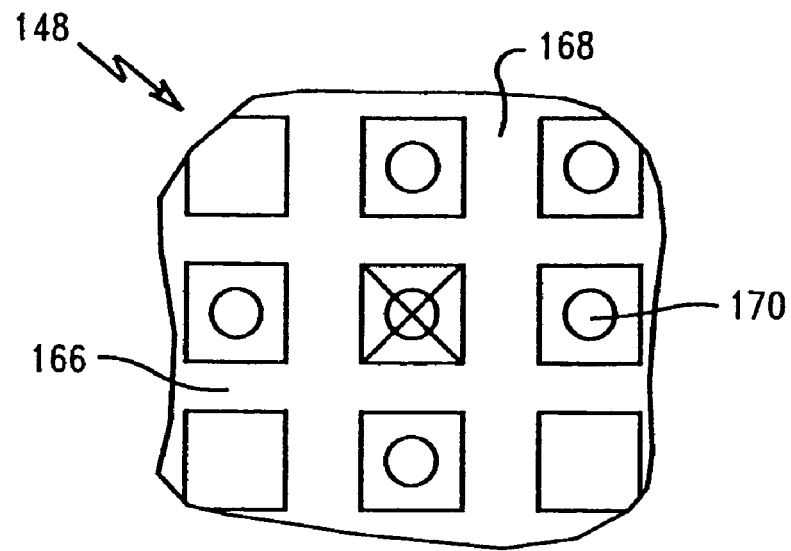
FIG. 4A is a schematic partial plan view of a portion of a screened substrate screened using a mask which has been cooled with the cooling plate of the invention after a heated cleaning step and showing via pattern features.
Figure 4B:
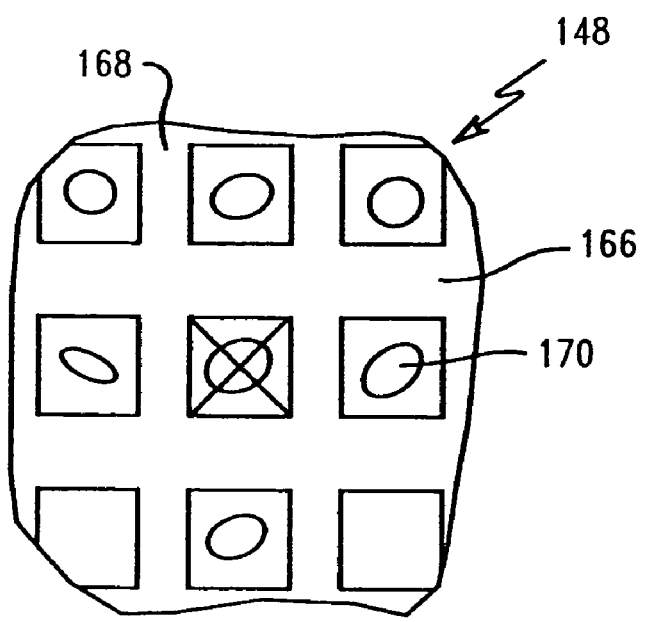
FIG. 4B is a schematic partial plan view of a screened substrate screened using a mask which has been conventionally cooled after a heated cleaning step and showing via pattern features.

Referring now to FIGS. 4A and 4B, the advantages of using the cooling plate of the invention can readily be seen. In FIG. 4A a screened substrate 148 was screened using a screening mask cooled with the cooling plate of the invention and it can be seen that the vias are still essentially circular and in the center of the screened opening. This is to be contrasted with FIG. 4B for which no cooling plate was used and the vias of the substrate are skewed.

FIGS. 5A–8B are schematic illustrations of how the cooling plate of the invention increases the thermal efficiency of the cooling step of the screen printing process.

In FIG. 5A a cooling plate 172 has a planar lower surface 174 and is positioned above a planar mask frame 176 supported on supports 178. In FIG. 5B the cooling plate 172 is in contact with the mask frame 176 and because both surfaces are planar the contact between the lower surface 174 of the cooling plate and the upper surface of the mask frame provide good thermal efficiency.

In FIG. 6A the cooling plate 172 is shown positioned above a warped mask frame 180. In FIG. 6B, which shows the cooling plate 172 in contact with the mask frame 180, there is a gap 182 between the lower surface 174 of cooling plate and the upper surface of the mask frame 180. This gap decreases the thermal efficiency of the cooling plate and can result in distorted pattern features such as shown in FIG. 4B.

FIG. 7A shows a cooling plate 184 of the invention having a downward concave lower surface 186. The cooling plate is positioned above a mask frame 176 supported on supports 178. In FIG. 7B the cooling plate 184 is in contact with the mask frame 176 and because of the curved lower surface 186 of the cooling plate and space (cantilever effect), mask frame 176 is bent downward and intimate contact is made between the mask frame 176 and the cooling plate 184. This results in a very high thermal efficiency and effective cooling of the mask frame.

In FIG. 8A the cooling plate 184 having a curved lower surface 186 is positioned above a mask frame 188 which is warped. However, when the cooling plate 184 is moved downward and in contact with the warped mask frame 188, the mask frame is bent further as shown in FIG. 8B and intimate contact is still made between the lower surface 186 of the cooling plate 184 and the mask frame 188. Even in this case where a warped mask frame is being cooled, enhanced thermal efficiency is achieved.

The cooling plate has one or more lower curved surfaces to ensure intimate contact between mask frame and cooling element. The cooling plate preferably also contains one or more of the following features: internal heat exchanging passages; timed contact of element to frame to achieve desired mask frame temperature; closed-loop feedback system utilizing temperature sensors to achieve desired mask frame temperature; wetted element contact surface to improve thermal transfer efficiency (achievable in cooling mode by lowering frame temperature to below room dew point); cooling element mounted with self-aligning gimble joint; and articulating mask frame support rails to compensate for any mask frame thickness or flatness irregularities.

It is also contemplated that the mask frame could be contacted on both its top and/or bottom surfaces by the cooling plate or plates.

Cold plate conduction cooling has been found to be effective, quick, quiet, and inexpensive. For example, a drop of 40° F. in 10 seconds can easily be achieved. The exact amount of time can be determined by monitoring the temperature of the mask and lifting the plate when the desired temperature is reached.

Figure 9:
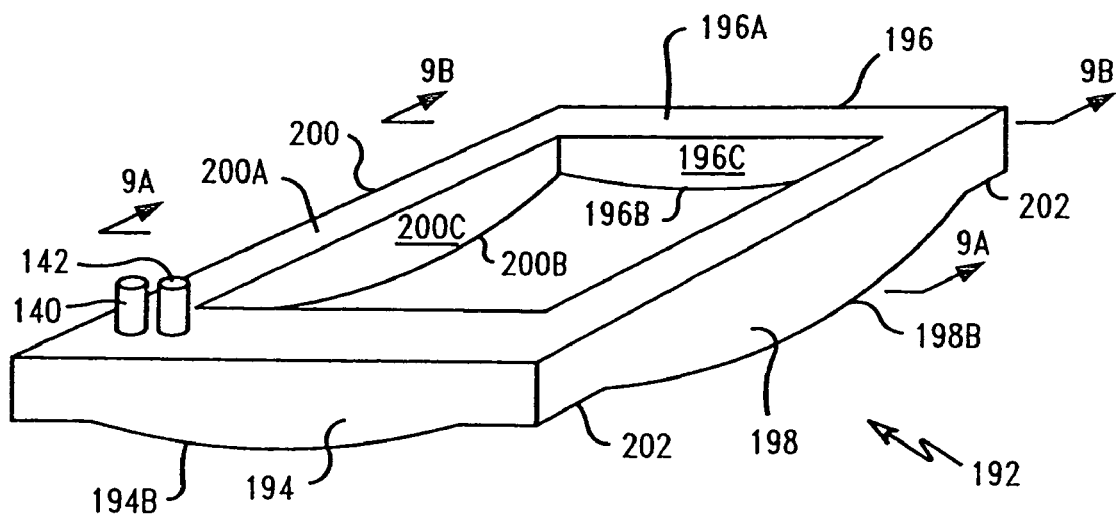
FIG. 9 is a perspective view of another cooling plate of the invention.

Referring to FIG. 9, another cooling plate of the invention is shown generally as numeral 192. The cooling plate has a front side 194, a rear side 196 and opposed sides 198 and 200. All sides have a downward concave lower surface 194B, 196B, 198B and 200B, respectively. At each corner of the cooling plate is a planar section shown as numeral 202. An inlet cooling water port is shown as numeral 140 and outlet cooling water port as numeral 142.

Figure 9A:
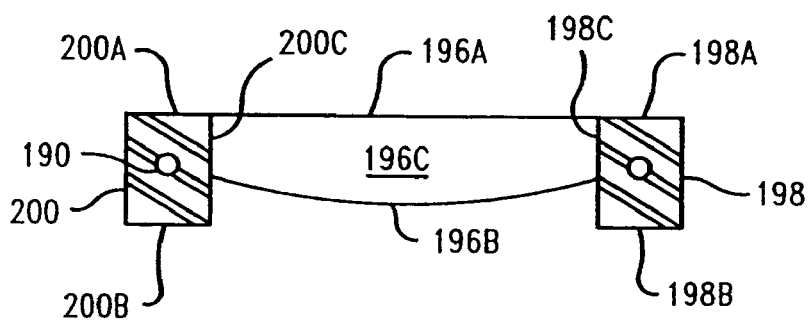
FIG. 9A is a cross-sectional view of the cooling plate of FIG. 9 taken along lines 9A—9A.

FIG. 9A shows the cooling plate 192 in section wherein the lower surfaces 198B and 200B and 196B will be in contact with the mask frame as described above for the cooling plate shown in FIG. 3B. In this case all lower surfaces of the cooling plate would contact corresponding upper surfaces of the mask frame and bend all sides of the mask frame. This is preferably accomplished by supporting the mask frame at the corners on individual posts rather than the rail support system shown in FIG. 3 which corner post support is shown in FIGS. 5A–8B.

Figure 9B:
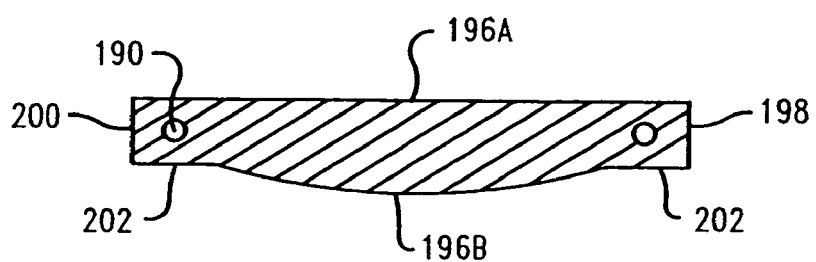
FIG. 9B is a cross-sectional view of the cooling plate of FIG. 9 taken along lines 9B—9B.

FIG. 9B shows a section of a cooling plate 192 taken through the solid rear side 196 of the cooling plate 192. The concave lower surface 196B is shown as are the corner planar sections 202.

Figure 9C:
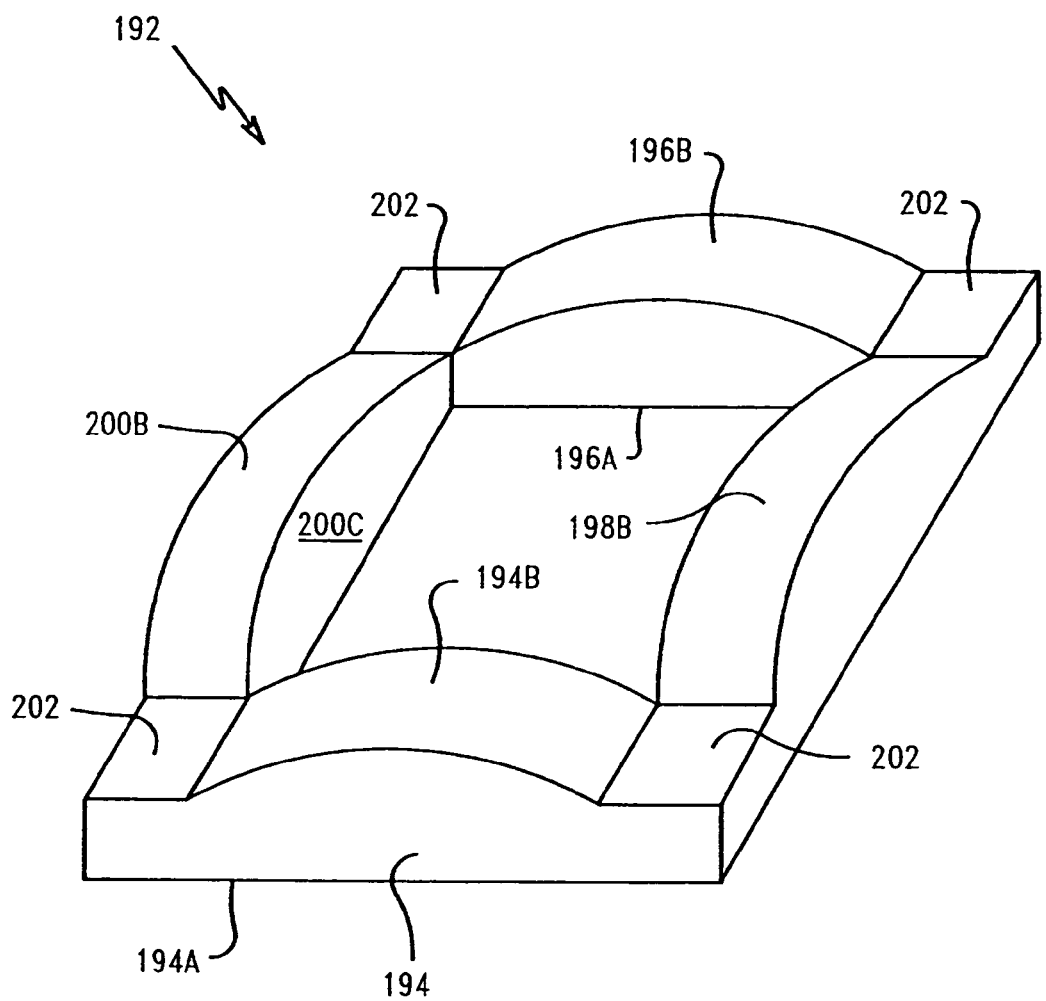
FIG. 9C is a perspective bottom view of the cooling plate of FIG. 9.

FIG. 9C shows the lower surfaces of the cooling plate 192. As can be seen, each side has a downward curved surface 194B, 196B, 198B and 200B. At each corner of the cooling plate is a planar surface.

Figure 10:
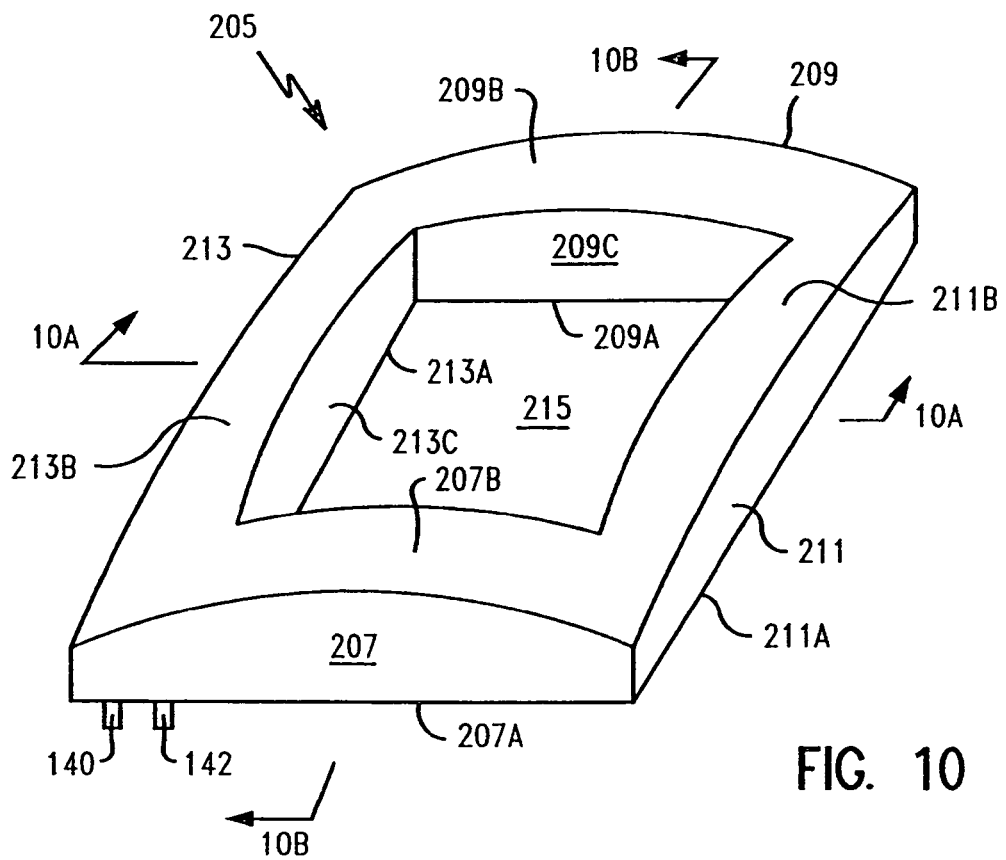
FIG. 10 is a perspective bottom view of another cooling plate of the invention.

Referring to FIG. 10, another cooling plate of the invention is shown generally as numeral 205. The cooling plate has a front side 207, a rear side 209, and opposed sides 211 and 213. All sides have a downward concave lower surface 207B, 209B, 211B and 213B, respectively, and an inlet cooling water port 140 and an outlet cooling water port 142.

Cooling plate 205 is preferably fabricated from a spherical block of metal having a planar side and the opposed side being spherical in a desired radius. As shown in FIG. 10, the block would then be squared off to form sides 207, 209, 211 and 213. Through opening 215 can be cut through the spherical plate forming the concave downward lower surfaces 207B, 209B, 211B and 213B and the planar upper surfaces 207A, 209A, 211A and 213A.

Figure 10A:
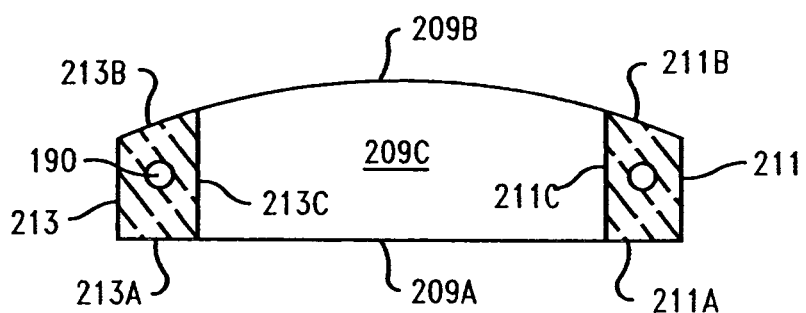
FIG. 10A is a cross-sectional view of the cooling plate of FIG. 10 taken along lines 10A—10A.

FIG. 10A shows the cooling plate 205 in section wherein the lower surfaces 211B and 213B and 209B will be in contact with the mask frame as similarly described above for the cooling plate shown in FIG. 3B. In the cooling plate of FIG. 10, all lower concave surfaces of the cooling plate would contact corresponding upper surfaces of the mask frame and bend all sides of the mask frame. This is preferably accomplished by supporting the mask frame at the corners with individual posts rather than the rail support system shown in FIG. 3. Corner post supports are shown in FIGS. 5A-8B. Internal cooling passages are shown as numeral 190.

Figure 10B:
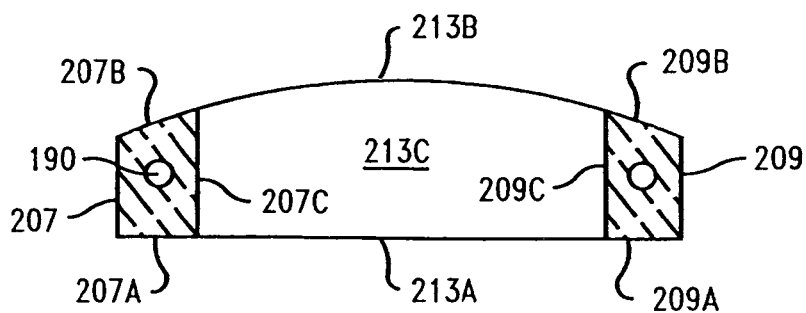
FIG. 10B is a cross-sectional view of the cooling plate of FIG. 10 taken along lines 10B—10B.

FIG. 10B shows another section of the cooling plate 205 wherein lower surfaces 207B, 209B and 213B are all concave.

As will be appreciated by those skilled in the art, FIGS. 10A and 10B are symmetrical because the cooling plate 205 was formed from a planar plate having a spherical surface. Accordingly, the lower surfaces of the cooling plate remaining after the opening 215 has been formed therein will all be concave downward.

Other similar cooling plate designs are contemplated herein with the proviso that the one or more of the lower (or upper) surfaces of the cooling plate be concave so that the mask frame is bent when in contact with the concave surface.

The cooling plate is preferably made of a material of a high thermal conductivity such as copper and preferably has one or more internal cooling passages as shown in the figures. Preferably the cooling plate has a gimble mount so that it is self-aligning when in contact with the mask frame. The thickness of the cooling plate will be sufficient to bend the mask frame without being bent itself when a force is applied to contact the cooling plate with the mask frame. In general, the thickness of the cooling plate will be about 1 to 2 inches, e.g., 1½ inch.

The mask frame is typically made of stainless steel or other such metal and has a thickness of about ⅟₁₆ to ³⁄₁₆ inch, e.g., ⅛ inch. The screening mask is made of Mo and has a thickness generally of about 3 to 4 mil.

In operation, the force applied to the cooling plate against the mask frame will be up to about 150 lbs. or more. The force is sufficient to bend the mask frame and provide the intimate contact between the cooling plate and mask frame needed to achieve uniform and efficient cooling of the mask frame.

Referring back to FIGS. 2 and 2D, the concave surface of the cooling plate has a cylindrical radius of about 0.030 inch but this may vary widely. As discussed above, one method of making the cooling plate is to form a solid plate having a desired cylindrical face or spherical face radius and then to form an opening in the middle of the plate. It will be appreciated by those skilled in the art that any appropriate cylindrical face or spherical face radius can be used with the proviso that the cooling plate is able to bend the mask frame without damaging the mask frame or the screening mask held in the frame.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of cooling a mask frame and screening mask used in a screen printing process comprising the steps of:
   providing a cooling section having spaced apart rails or supports on which a mask frame holding a screening mask rests wherein one or more of the sides of the mask frame is cantilevered and can be bent in the space between the rails or supports;
   providing a cooling plate in the cooling section having a front side, rear side and opposed sides and corresponding lower surfaces and upper surfaces which lower surfaces contact the corresponding upper surfaces of the mask frame, with at least one of the lower surfaces of the cooling plate being concave downward;
   providing means to vertically raise and lower the cooling plate;
   moving a heated cleaned screening mask and mask frame to the cooling section;
   lowering the cooling plate and contacting the lower surfaces of the cooling plate with the upper surfaces of the mask frame whereby the corresponding sides of the mask frame and cooling plate mate and one or more sides of the mask frame are bent downward because of the concave curvature of the lower surface of the cooling plate;
   cooling the mask frame and screening mask with the cooling plate; and
   removing the cooled mask frame and screening mask from the cooling section.

2. The method of claim 1 wherein two of the lower surfaces of the cooling plate are concave downward.

3. The method of claim 2 wherein the cooling plate is made from a cylindrical metal plate.

4. The method of claim 1 wherein all the lower surfaces of the cooling plate are concave downward.

5. The method of claim 4 wherein the cooling plate is made from a spherical plate.

6. The method of claim 1 wherein all the lower surfaces of the cooling plate have concave surfaces with the corners being planar.

7. The method of claim 1 further comprising:
   providing a screening section having means to apply a screening paste onto a surface of a screening mask secured to a mask frame and which paste is forced through openings in the screening mask to form a pattern on a substrate surface and a cleaning section having means to clean the screening mask of screening paste residue;
   a planar mask frame is provided having a front side, a rear side, and opposed sides and corresponding upper surfaces and lower surfaces and a central through opening therein; and
   the screening mask is secured to the lower surfaces of the mask frame, the screening mask having mask openings therein in the central opening of the mask frame forming a pattern to be screened onto the substrate surface.

8. An apparatus for cooling a mask frame and screening mask used in a screen printing process comprising:
   a cooling section for cooling a cleaned screening mask held in a mask frame, the cooling section having a pair of spaced apart rails or supports on which the lower surfaces of the mask frame rests wherein one or more sides of the frame is cantilevered with the screening mask secured to the lower side of the mask frame being between the rails or posts;
   a cooling plate in the cooling section having a front side, rear side and opposed sides, and corresponding lower surfaces and upper surfaces which lower surfaces contact the upper surfaces of the mask frame, with at least one of the lower surfaces of the cooling plate being concave downward;

means to vertically raise and lower the cooling plate;

means for positioning the cleaned mask frame and the screening mask in the screening section;

wherein in a cleaning section, the mask frame and screening mask are cleaned at an elevated temperature and then moved to the cooling section where the cooling plate is lowered to contact the lower surfaces of the cooling plate with the upper surfaces of the mask frame whereby the upper surfaces of the mask frame and corresponding lower surfaces of the cooling plate are mated and at least one of the sides of the mask frame are bent downward because of the concave curvature of the cooling plate and the cantilevered mask frame and the mask frame and screening mask are cooled.

9. The apparatus of claim 8 wherein two of the lower surfaces of the cooling plate are concave downward.

10. The apparatus of claim 9 wherein the cooling plate is made from a cylindrical metal plate.

11. The apparatus of claim 8 wherein all the lower surfaces of the cooling plate are concave downward.

12. The apparatus of claim 11 wherein the cooling plate is made from a spherical plate.

13. The apparatus of claim 8 wherein all the lower surfaces of the cooling plate have concave surfaces with the corners being planar.

14. The apparatus of claim 8 further comprising:

a screening section having means to apply a screening paste onto a surface of a screening mask held on the lower surfaces of a mask frame, the frame having a front side, rear side, and opposed sides and corresponding upper surfaces and lower surfaces, and a central through opening therein; and a cleaning section having means to clean the screening mask of screen paste residue.

* * * * *